(12) United States Patent
Sampath et al.

(10) Patent No.: US 7,940,088 B1
(45) Date of Patent: May 10, 2011

(54) HIGH SPEED PHASE FREQUENCY DETECTOR

(75) Inventors: Parthasarathy Sampath, Bangalore (IN); Vikas Choudhary, Bangalore (IN)

(73) Assignee: PMC-Sierra, Inc., Santa Clara, CA (US)

( * ) Notice: Subject to any disclaimer, the term of this patent is extended or adjusted under 35 U.S.C. 154(b) by 70 days.

(21) Appl. No.: 12/415,426

(22) Filed: Mar. 31, 2009

(51) Int. Cl.
*H03D 13/00* (2006.01)
*G01R 25/00* (2006.01)

(52) U.S. Cl. ....... 327/12; 327/3; 327/5; 327/7; 327/156; 331/25

(58) Field of Classification Search ................. 327/2, 3, 327/5, 7–10, 12, 40–43, 147, 150, 156, 159, 327/163; 331/25
See application file for complete search history.

(56) References Cited

U.S. PATENT DOCUMENTS

| | | | |
|---|---|---|---|
| 4,902,920 A * | 2/1990 | Wolaver | 327/12 |
| 5,191,239 A | 3/1993 | Rogers | |
| 5,220,293 A | 6/1993 | Rogers | |
| 5,422,603 A | 6/1995 | Soyuer | |
| 5,825,210 A | 10/1998 | Oh | |
| 5,892,380 A | 4/1999 | Quist | |
| 6,037,806 A | 3/2000 | Smith et al. | |
| 6,265,902 B1 * | 7/2001 | Klemmer et al. | 327/2 |
| 6,441,691 B1 * | 8/2002 | Jones et al. | 331/25 |
| 6,538,475 B1 | 3/2003 | Johansen et al. | |
| 6,856,202 B2 * | 2/2005 | Lesso | 331/1 A |
| 6,924,677 B2 * | 8/2005 | Lee | 327/147 |
| 7,003,065 B2 * | 2/2006 | Homol et al. | 375/376 |
| 7,053,666 B2 * | 5/2006 | Tak et al. | 327/3 |
| 7,092,475 B1 | 8/2006 | Huard | |

OTHER PUBLICATIONS

Soyuer, et al.; Frequency Limitations of a Conventional Phase-Frequency Detector; IEEE Journal of Solid-State Circuits; vol. 25; No. 4; pp. 1019-1022; Aug. 1990.
Mansuri, et al.; Fast Frequency Acquisition Phase-Frequency Detectors for GSamples/s Phase-Locked Loops; IEEE Journal of Solid-State Circuits; vol. 37; No. 10; pp. 1331-1334; Oct. 2002.
Centurelli, et al.; Robust Three-State PFD Architecture with Enhanced Frequency Acquisition Capabilities; ISCAS (IEEE International Symposium on Circuits and Systems) 2004; IEEE; pp. IV-812-IV-815; 2004.
Jeon, et al.; Phase/Frequency Detectors for High-Speed PLL Applications; Electronics Letters; vol. 34; No. 22; pp. 2120-2121; Oct. 29, 1998.

* cited by examiner

*Primary Examiner* — Lincoln Donovan
*Assistant Examiner* — Patrick O'Neill
(74) *Attorney, Agent, or Firm* — Knobbe Martens Olson & Bear LLP (57) ABSTRACT

Apparatus and methods detect missing clock edges. An improved phase frequency detector (PFD) can be used in, for example, a phase locked loop (PLL) or a delay locked loop (DLL). Conventional PFDs can miss clock edges. Disclosed is a missing clock edge detection circuit that reliably detects these missing clock edges to correctly activate switches of a charge pump of the PLL or DLL. Embodiments exhibit relatively little of the characteristic polarity reversal of conventional PLL or DLL circuits, which then enables embodiments to operate faster and acquire phase lock quicker than conventional circuits. Such techniques are useful in clock synthesis, clock recovery, and the like. The invention can further include an optional circuit that detects when the missing clock edge detection circuit may have inaccurately determined (false positive) that a clock edge had been missed, to override the corrective action by the missing clock edge detection circuit.

14 Claims, 9 Drawing Sheets

___________  Ideal PFD Transfer Curve

- - - - - - -  Non-ideal PFD Transfer Curve

___________  Flat Kpd Prior Art PFD Transfer Curve

HIGH SPEED PHASE FREQUENCY DETECTOR

BACKGROUND

1. Field of the Invention

The invention generally relates to electronics. In particular, the invention relates to phase locked loop (PLL) and delay locked loop (DLL) circuits.

2. Description of the Related Art

Figure 1:
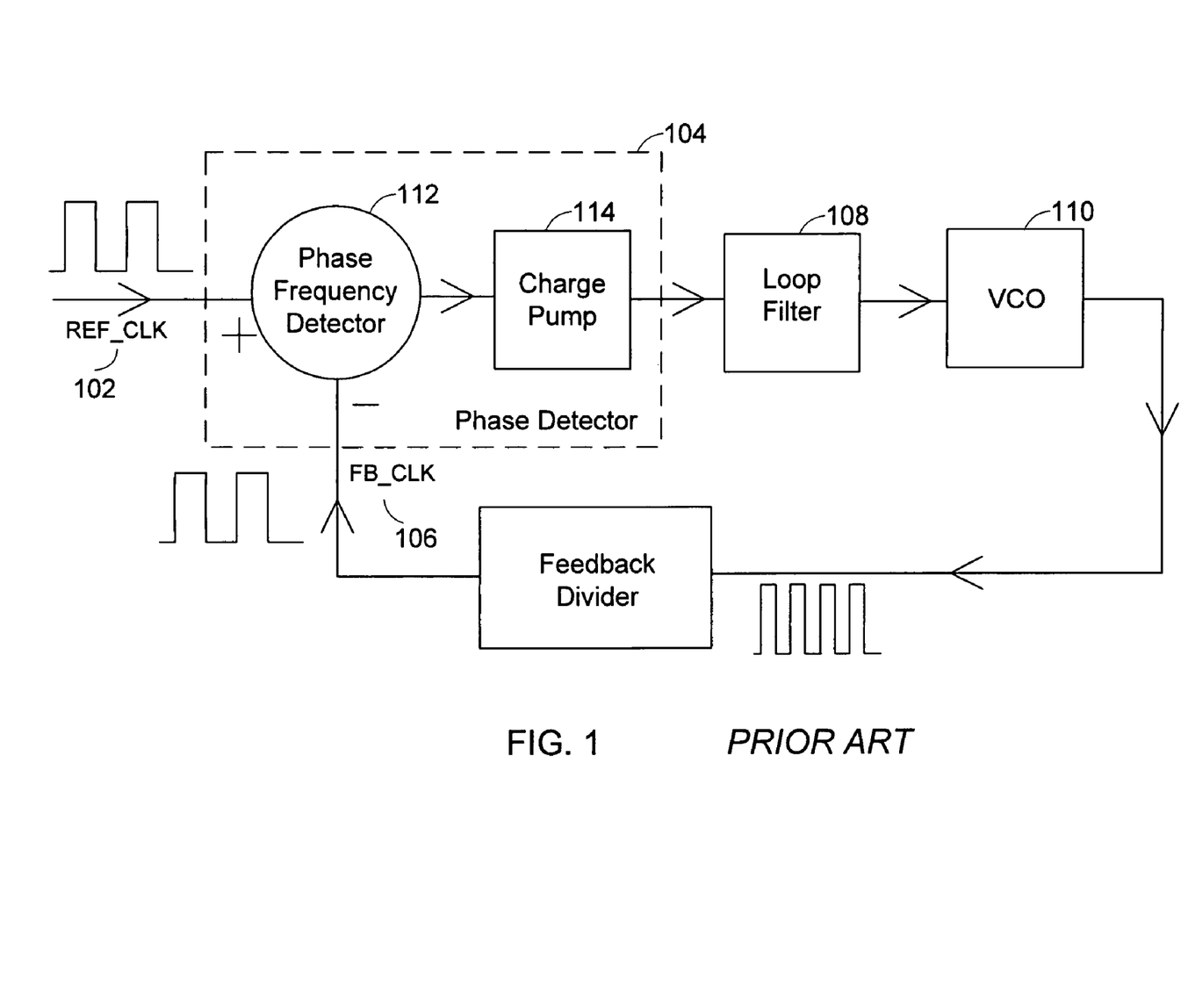
FIG. 1 illustrates a conventional phase locked loop (PLL).

It is common in electronics to use high speed (multi-GHz) clock phase generation, frequency multiplication (clock synthesis), and/or clock and data recovery. The PLL (phase locked loop) is an efficient and modern technique to implement these functions. An example of a conventional PLL is illustrated in FIG. 1. The illustrated PLL is a feedback loop system in which the input clock signal 102 (can be embedded with data) is discriminated in phase by a phase detector 104 with respect to a feedback clock signal 106 and further processed through a loop filter 108 and a voltage-controlled oscillator (VCO) 110. In the diagram, capacitance for the charge pump (QP) 114 is included in the loop filter 108.

The phase detector 104 includes a phase frequency detector (PFD) 112 and a charge pump (QP) 114. Advances in PFD 112 design have not kept up with advances to VCO 110 design, as reference clock input requirements have typically remained low. However, the absence of advancements has prevented the use of PLLs with relatively high-speed signals.

Figure 2:
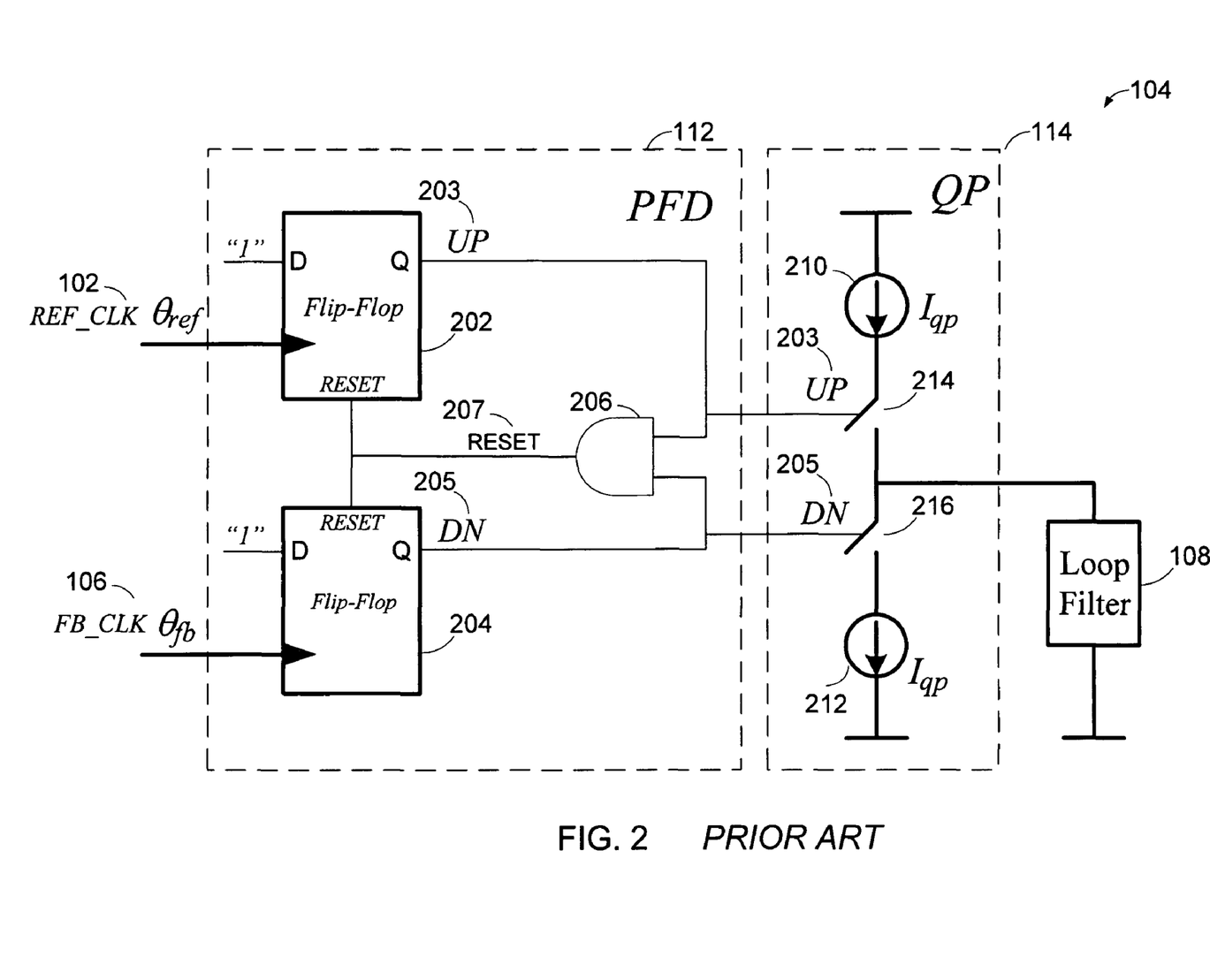
FIG. 2 illustrates a conventional 3-state phase frequency discriminator (PFD) and a charge pump (QP).
Figure 3A:
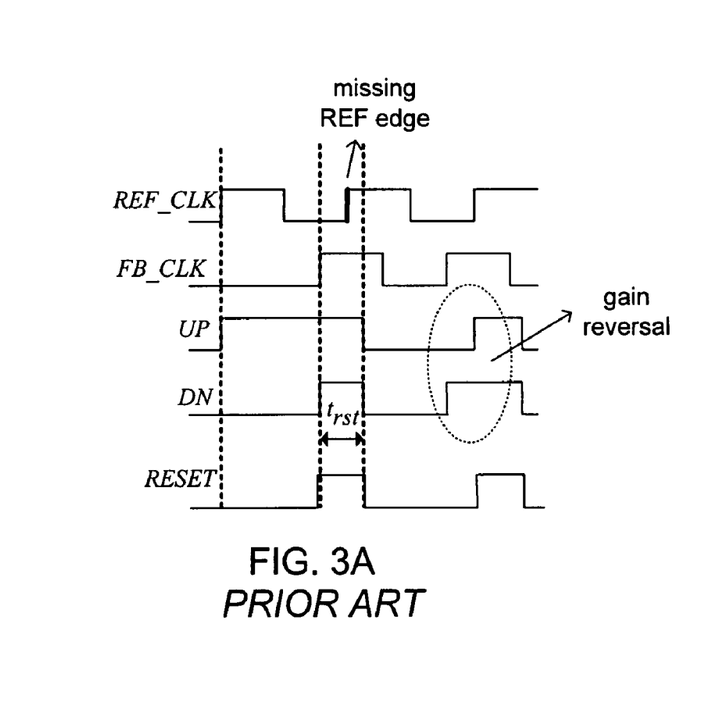
FIG. 3A illustrates the miss of a clock edge.
Figure 3B:
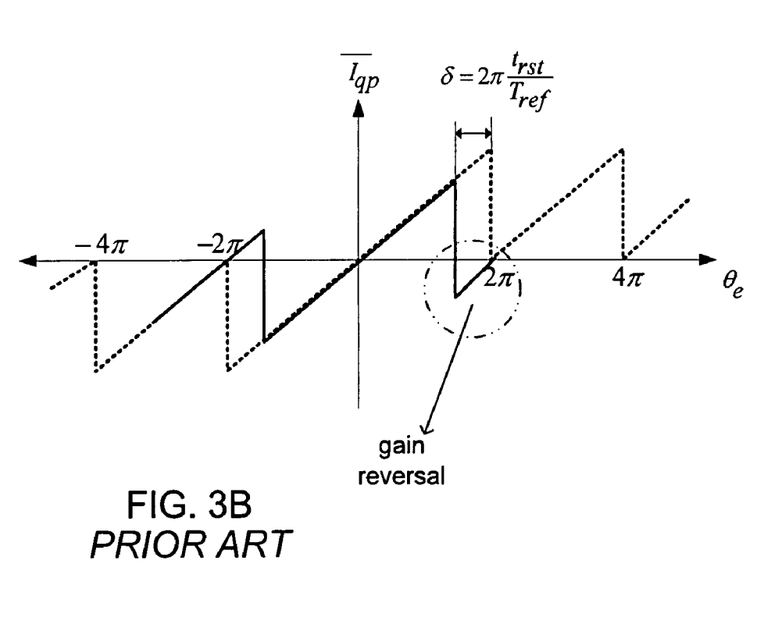
FIG. 3B illustrates a transfer curve for a conventional phase detector (PD).

FIG. 2 illustrates a conventional implementation of a phase detector comprising a 3-state phase frequency discriminator (PFD) 112 and a charge pump (QP) 114. The PFD 112 includes flip-flops 202, 204 and an AND gate 206. The charge pump (QP) 114 includes current sources 210, 212, switches 214, 216. The loop filter 108, can include capacitance for storing charge for the charge pump (QP) 114. A switch 214 or 216 is closed when the output (up signal 203 or down signal 205) of the corresponding flip-flop 202 or 204 is high. The up signal 203 and the down signal 205 are control signals. The up signal 203 is high for longer than the down signal 205 is high when the input clock signal REF_CLK 102 is leading the feedback clock signal FB_CLK 106. Conversely, when the input clock signal REF_CLK 102 is lagging the feedback clock signal FB_CLK 106, the down signal 205 is high for longer than the up signal 203. The operation of the switches controls the charge accumulated by the loop filter 108, and the resulting voltage across the loop filter 108 controls the VCO 110. A problem that plagues the conventional implementation is shown in FIGS. 3A and 3B.

A reset signal 207 is generated by the logical AND 206 of the UP signal 203 output of the UP flip-flop 202 and the DN signal 205 output of the DN flip-flop 204. As illustrated in FIG. 3A, a pulse of the reset signal 207 has a finite, non-zero, width $t_{rst}$, i.e., cannot be infinitely small. As frequencies increase, the width $t_{rst}$ of the reset pulse begins to intrude into the linear range of operation. As illustrated in FIG. 3B, at high frequencies, the width $t_{rst}$ of the pulse of the reset signal 207 converts the intended asymmetrical behavior of a three-state PFD 112 (shown by dotted lines) into a symmetrical two-state phase detector (bold solid lines), which is detrimental to the frequency locking process.

The conventional art describes two approaches to using a PFD 112 at high frequencies. One approach reduces the width of the reset pulse. A second approach reduces the gain ($K_{PD}$) of the phase detector 104 beyond a certain phase difference. Both approaches will be discussed below.

Reducing the pulse width $t_{rst}$ of the pulse for the reset signal 207 of the PFD 112 has many implications. For shorter pulse widths $t_{rst}$, the switches 214, 216 of the charge pump (QP) 114 should be faster. In addition, faster or advanced logic styles may be needed. See, for example, U.S. Pat. No. 7,053,666 to Tak, et al. There is a limit to how narrow the pulses from the PFD 112 can be because the charge pump (QP) 114 uses a finite amount of time to switch ON or OFF and will be unresponsive if not provided with at least the minimum amount of time. Furthermore the PFD 112 should also detect instances of missing edges across a wider zone. See, for example, Mansuri, et al., in *Fast Frequency Acquisition Phase-Frequency detectors for G-samples/s Phase-Locked Loop*, IEEE Journal of Solid State Physics, Vol. 37, No. 10, pp. 1664-1334, October 2002; U.S. Pat. No. 5,892,380 to Quist; and U.S. Pat. No. 7,053,666 to Tak, et al.

Figure 4:
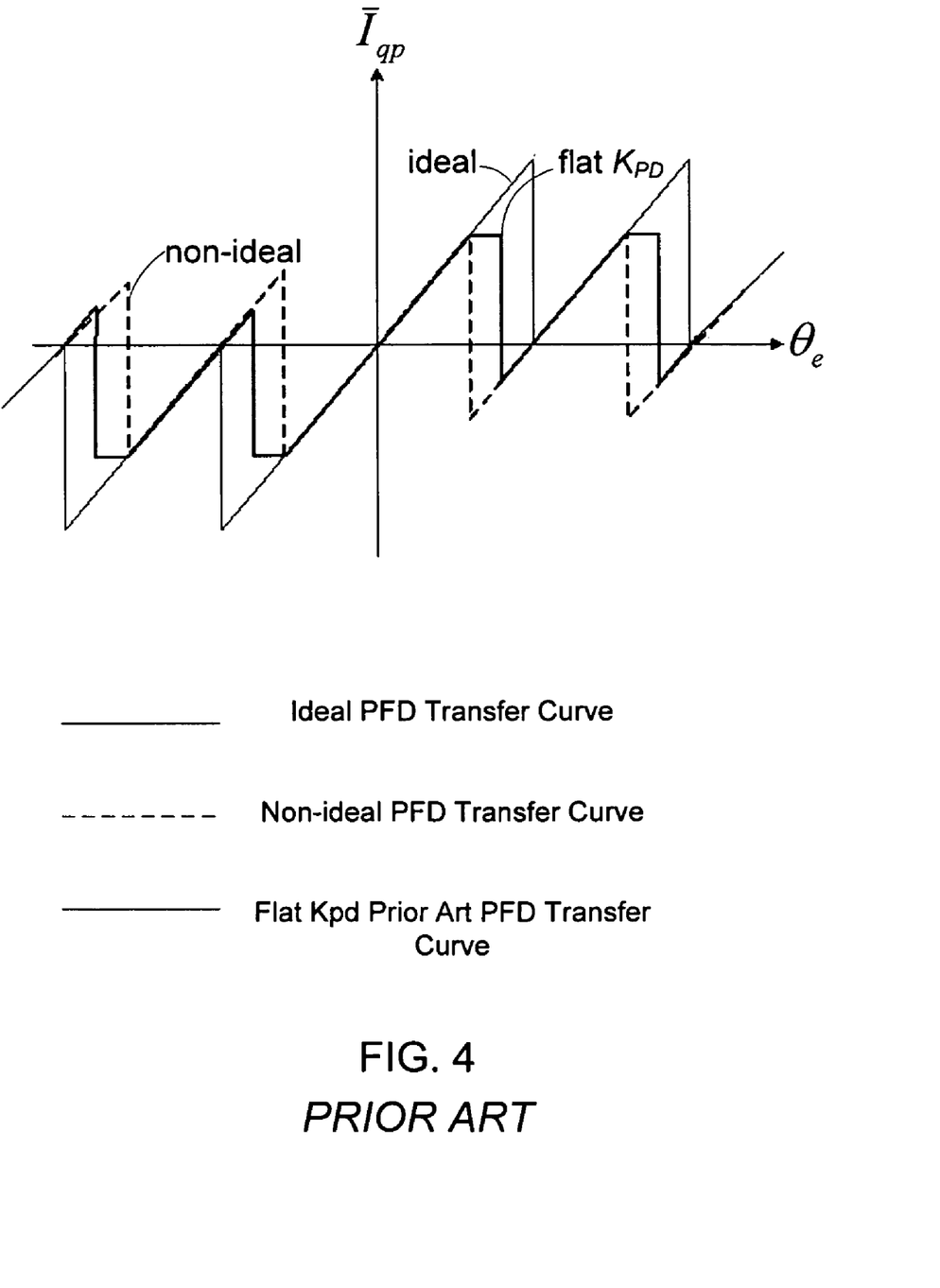
FIG. 4 illustrates a transfer characteristic of an ideal PD, non-ideal PD, and a PD with a flat gain.

The gain ($K_{PD}$) of the phase detector 104 can be reduced for missing clock pulses. FIG. 4 illustrates a simulation of a transfer characteristic of an ideal PD, non-ideal PD, and a PD with a flat gain. Typically, the gain is reduced to no gain. This reshaping of the transfer characteristic avoids the problem of gain reversal shown in FIGS. 3A and 3B. The gain reduction can be implemented by generating a small pulsed signal. See, for example, Mansuri, et al., in *Fast Frequency Acquisition Phase-Frequency detectors for G-samples/s Phase-Locked Loop*, IEEE Journal of Solid State Physics, Vol. 37, No. 10, pp. 1664-1334, October 2002 and Centurelli, et al., *Robust three-state PFD architecture with enhanced frequency acquisition capabilities*, Proceedings of the 2004 International Symposium on Circuits and Systems (ISCAS) 2004, Vol. 4, May 23-26, 2004, pp. 812-15.

Reducing the gain ($K_{PD}$) of the phase detector 104 can have implications. To trigger one of the flip-flops 202, 204 (FIG. 2), a small pulse is generated at an input clock of the corresponding flip-flop 202, 204. The gain reduction technique adjusts the delay between the reset pulse with respect to that of the trigger to the flip-flops 202, 204. This delay can be sensitive to various process, voltage, and temperature (PVT) variations, on the rise and fall time of the clocks, and is typically limited to implementations of only high-speed logic families.

The small pulse should be smaller in width than the width of the reset pulse or the PLL can fail to lock at zero phase difference. This mandates even faster switching of the charge pump (QP) 114, or there can be zones of no response from the PFD-QP combination. The gain reduction technique can still result in partial output polarity reversal.

SUMMARY OF THE DISCLOSURE

The invention includes an improved phase frequency detector (PFD) that can be used in, for example, a phase locked loop (PLL) or a delay locked loop (DLL). Conventional PFDs can miss clock edges. Disclosed is a missing clock edge detection circuit that reliably detects these missing clock edges to correctly activate switches of a charge pump of the PLL or DLL. Embodiments do not exhibit the characteristic polarity reversal of conventional PLL or DLL circuits, which then enables embodiments to operate at higher frequencies than conventional circuits and to acquire phase lock quicker than conventional circuits. Such techniques are useful in clock synthesis, clock recovery, and the like.

The invention can further include an optional circuit that detects when the missing clock edge detection circuit may have inaccurately determined (false positive) that a clock edge had been missed, to override the corrective action by the missing clock edge detection circuit.

BRIEF DESCRIPTION OF THE DRAWINGS

These drawings and the associated description herein are provided to illustrate specific embodiments of the invention and are not intended to be limiting.

DETAILED DESCRIPTION OF SPECIFIC EMBODIMENTS

Although particular embodiments are described herein, other embodiments of the invention, including embodiments that do not provide all of the benefits and features set forth herein, will be apparent to those of ordinary skill in the art.

A speed limitation in a phase frequency discriminator (PFD) 112 arises from the physical limitation on the minimum reset pulse width from the PFD 112. The up switch 214 and the down switch 216 of the charge pump (QP) 114 use a finite amount of time to operate, which places limitations on the minimum width of a pulse of the reset signal 207. A reset pulse having a finite (non-zero) duration mitigates against a dead zone near the origin in the transfer function. However, as described earlier in connection with FIG. 3A, a transition during a reset pulse does not trigger an up (UP) or down (DN) pulse. These missing clock pulses can cause the phase detector (PD) 104 to misjudge the direction of the phase difference, a condition that is known as output polarity reversal.

As the frequency of the input clocks increases, the portion of the reset pulse width relative to the total reference clock cycle also increases, and the PFD-QP characteristics become less asymmetrical as shown by solid lines in FIG. 3B. An asymmetrical characteristic helps the phase detector (PD) 104 to distinguish positive frequency errors from the negative ones. With a loss in asymmetry, the phase detector (PD) 104 can issue incorrect phase information, which can inhibit the acquisition process. A practical upper frequency limit for a conventional phase detector (PD) 104 is about $(2 \cdot t_{rst})^{-1}$, where $t_{rst}$ is the reset pulse width.

One embodiment of the invention overcomes the conventional speed limitation by introducing a reliable form of missing clock edge detection (MCED). The MCED dependably detects missing pulses based on (1) an expansion of the detection space for possible missing clock edge (MCE) scenarios; and (2) robust detection logic.

Missing Clock Edge Detection (MCED) Situations

Figure 5:
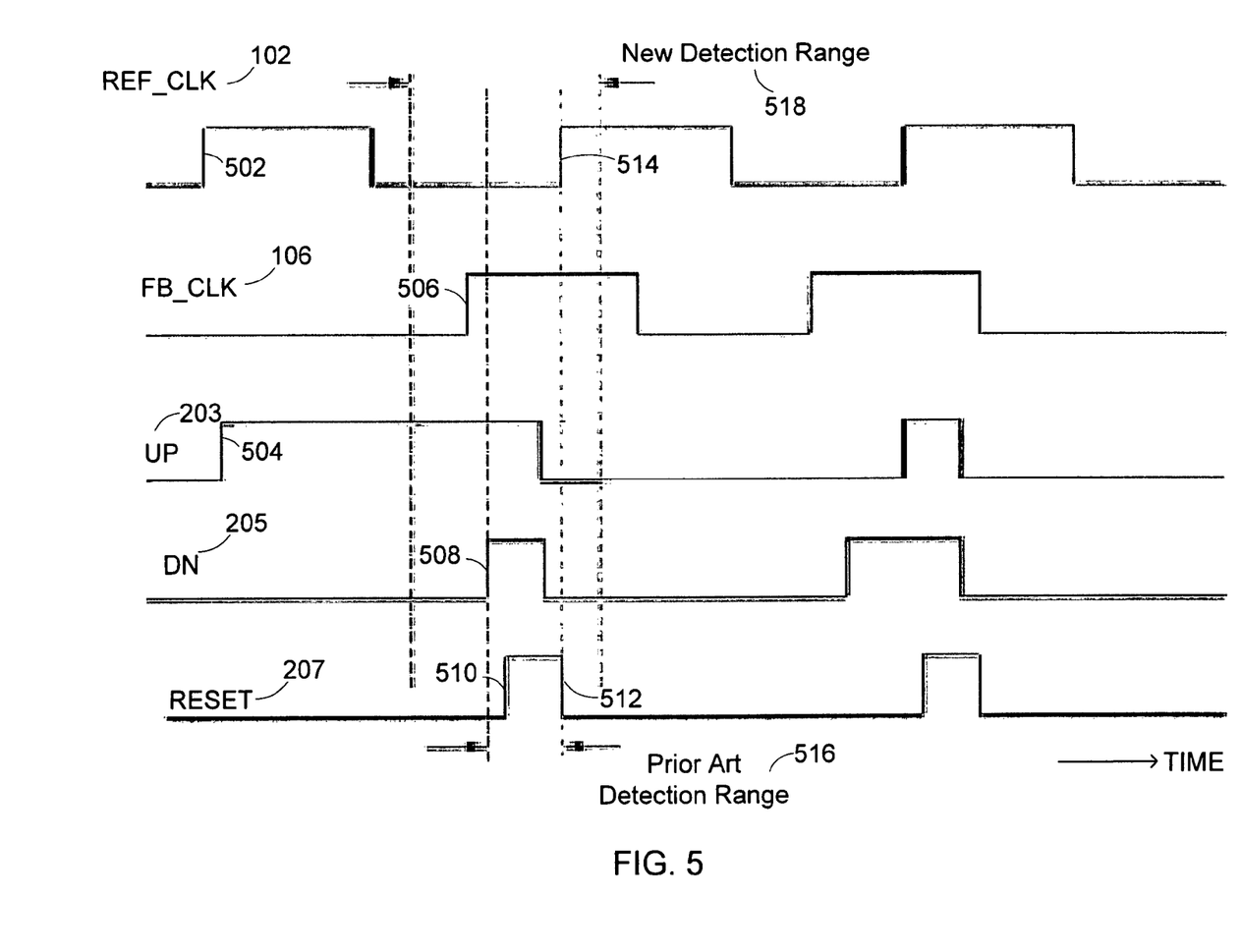
FIG. 5 is a timing diagram of a conventional PFD.

Applicants have observed two situations in which a missing clock edge (MCE) can occur in a conventional PFD 112: (1) when the next clock edge from an input clock signal REF_CLK 102 or FB_CLK 106 occurs during a pulse of the reset signal 207 (when the reset signal 207 is high in the illustrated embodiment); and (2) when a reset occurs during the setup/hold time of the particular flip-flop 202, 204 that is triggering a pulse of the UP signal 203 or the DN signal 205. FIG. 5 is a timing diagram illustrating these situations. From top to bottom, FIG. 5 includes waveforms for input clock signal REF_CLK 102, a feedback clock signal FB_CLK 106, the UP signal 203, the DN signal 205, and the reset signal 207.

A clock edge can be missed when the next clock edge from a clock signal REF_CLK 102 or FB_CLK 106 occurs during a pulse from the reset signal 207. In the illustrated example, the flip-flops 202, 204 (FIG. 2) have clock inputs that are triggered on rising edges of the clock signals 102, 106 such that the PLL or DLL in which the phase detector 104 is used aligns the rising edges of the clock signals 102, 106. A clock edge from the input clock signal REF_CLK 102 (or the feedback FB_CLK 106) can be missed when a pulse from the DN signal 205 (or UP signal 203) occurs very close to the next rising edge of the input clock signal REF_CLK 102 (or feedback clock signal FB_CLK 106). FIG. 5 illustrates a case in which a clock edge is missed from the input clock signal REF_CLK 102.

A rising edge 502 of the input clock signal REF_CLK 102 is detected by the UP flip-flop 202, and the UP signal 203 goes high as indicated by a rising edge 504. A rising edge 506 of the clock signal FB_CLK 106 occurs, which triggers the DN flip-flop 204, and the DN signal 205 goes high as indicated by a rising edge 508. As both the UP signal 203 and the DN signal 205 are high, the AND gate 206 generates the reset signal 207 as indicated by the rising edge 510. A high level of the reset signal 207 resets or clears the flip-flops 202, 204, which in turn causes the reset signal 207 to go low as indicated by the falling edge 512.

However, a subsequent rising edge 514 of the input clock signal REF_CLK 102 is missed. As illustrated, there is no corresponding rising edge of the UP signal 203. This occurs because the rising edge 514 is too close in time to the active portion (high level) of the reset signal 207. Reducing the width of the reset signal 207 can change when a missed clock edge may occur, but does not change the probability that it could occur. As illustrated, the conventional PFD 112 has too narrow a detection range 516. The illustrated conventional detection range 516 is mostly determined by logic speed.

Also illustrated with the prior art waveforms is a broader detection range 518. An embodiment of the invention can have the broader detection range 518, as clock edges can be detected even during a setup/hold time of a triggering flip-flop. One embodiment of the invention further implements the logic for the broader detection range 518 in a robust manner.

Detection and Reset Circuit

Figure 6:
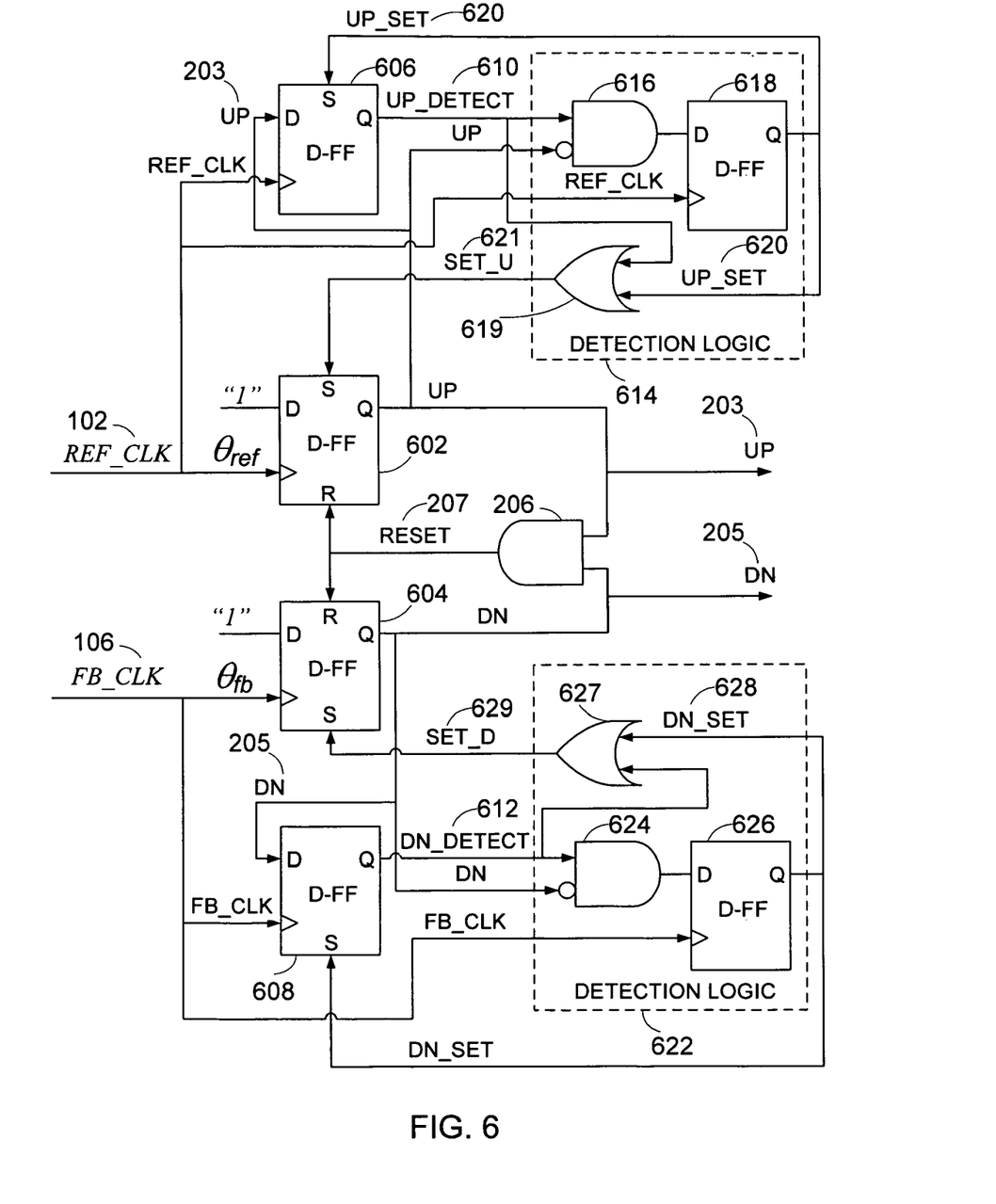
FIG. 6 illustrates a PFD according to one embodiment of the invention.

FIG. 6 illustrates a PFD 600 according to one embodiment of the invention that detects cases wherever the UP signal 203 (or the DN signal 205) is high before an edge of the input clock signal REF_CLK 102 (or the feedback clock signal FB_CLK 106) occurs. The PFD 600 can be used with a conventional charge pump 114 to form an improved phase detector. While illustrated in the context of rising edges as triggering edges and active-high logic, the principles and advantages described herein will be applicable to systems using falling edges and/or active-low logic or to combinations of both. For example, if desired, a rising edge can be used from one of the clock signals as a triggering edge and a falling edge can be used from the other for the triggering edge.

As illustrated in FIG. 6, one embodiment of the invention has an UP flip-flop 602, similar in function to the UP flip-flop 202 of FIG. 2 and a DN flip-flop 604, similar in function to the DN flip-flop 204 of FIG. 2. However, the UP flip-flop 602 and the DN flip-flop 604 also use a set input (forces an output of logic 1), which is indicated by an "S." The reset input (forces an output of logic 0) for the flip-flops 602, 604 is indicated with an "R." When a missing clock edge is detected, the flip-flip 602, 604 for the corresponding missing clock edge is set, such that the up signal (UP) 203 and/or the down signal (DN) 205 correctly activate the charge pump 114.

The circuit is symmetrical with respect to the "up" side versus the "down" side, and the following description describes the operation for the "up" side with the corresponding "down" side in parenthesis. A state machine can implement the following logic. In the context of a circuit using rising clock edges, a particular clock edge of the input clock signal REF_CLK 102 (or the feedback clock signal FB_CLK 106) is determined to have been missed, that is, is a "missing clock edge," when (1) the UP signal 203 (or the DN signal 205) is high for the immediately prior clock edge (first state) and (2) the UP signal 203 (or the DN signal 205) is low for the particular clock edge (second state). In response to the detection of the missing clock edge, the UP signal 203 (or the DN signal 205) is set (set high) as appropriate. The circuit of FIG. 6 illustrates an example of an implementation of the state machine. The circuit can be implemented within an integrated circuit, application specific integrated circuit (ASIC), field programmable gate array (FPGA), programmable logic device (PLD) or the like.

A D flip-flop 606 (or D flip-flop 608) is configured to store the state of the UP signal 203 (or the DN signal 205) at the rising edge of the corresponding clock signal REF_CLK 102 (or the clock signal FB_CLK 106) corresponding to the "immediately prior clock edge (first state)" described earlier. As will be explained later, the D flip-flop 606 (or the D flip-flop 608) can also be asynchronously set via an input labeled "S." The clock signal REF_CLK 102 (or the clock signal FB_CLK 106) is provided as an input to the clock input of the D flip-flop 606 (or D flip-flop 608). The UP signal 203 (or the DN signal 205) is provided as an input to the data (D) input of the D flip-flop 606 (or D flip-flop 608). The output UP_DETECT signal 610 of the D flip-flop 606 (or D flip-flop 608) is thus high if the UP signal 203 (or the DN signal 205) is high when the clock signal REF_CLK 102 (or clock signal FB_CLK 106) rises and low otherwise, which permits the D flip-flop 606 (D flip-flop 608) to detect when the UP signal 203 (or the DN signal 205) is high at the rising edge of corresponding clock signal REF_CLK 102 (or the clock signal FB_CLK 106).

The illustrated detection logic 614 includes an AND gate 616, a D flip-flop 618, and an OR gate 619. The AND gate performs a logical AND of the UP_DETECT signal 610 and an inverted version (also known as "false" version) of the UP signal 203. The bubble at the input of the AND gate 616 indicates inversion. An inverted version ($\overline{UP}$) of the UP signal 203 is typically available at an output of the D flip-flop 602. The output of the AND gate 616 is provided as an input to a D flip-flop 618, which is latched on the rising edge of the input clock signal REF_CLK 102 corresponding to "the particular clock edge (second state)" described earlier. When the output of the AND gate 616 is high at the rising edge of the input clock signal REF_CLK 102, the output UP_SET signal 620 is high, which is provided as an input to the OR gate 619. The OR gate 619 performs a logical OR of the UP_SET signal 620 and the UP_DETECT signal 610. When either or both of the UP_SET signal 620 or the UP_DETECT signal 610 is high, the output SET_U signal 621 goes high, which then asynchronously sets the UP flip-flop 602. When the UP flip-flop 602 is set, the output UP signal 203 is forced high, which then corrects the condition of the missing clock edge. The detection logic 622 having an AND gate 624, a D flip-flop 626, and an OR gate 627 operate in a likewise manner for generating a SET_D signal 629 for asynchrnously setting of the DN flip-flop 604 high. In contrast to the conventional techniques of attempting to minimize the pulse width of a pulse of the reset signal 207, the foregoing technique does not need to be used with special high-speed flip-flops.

Figure 7:
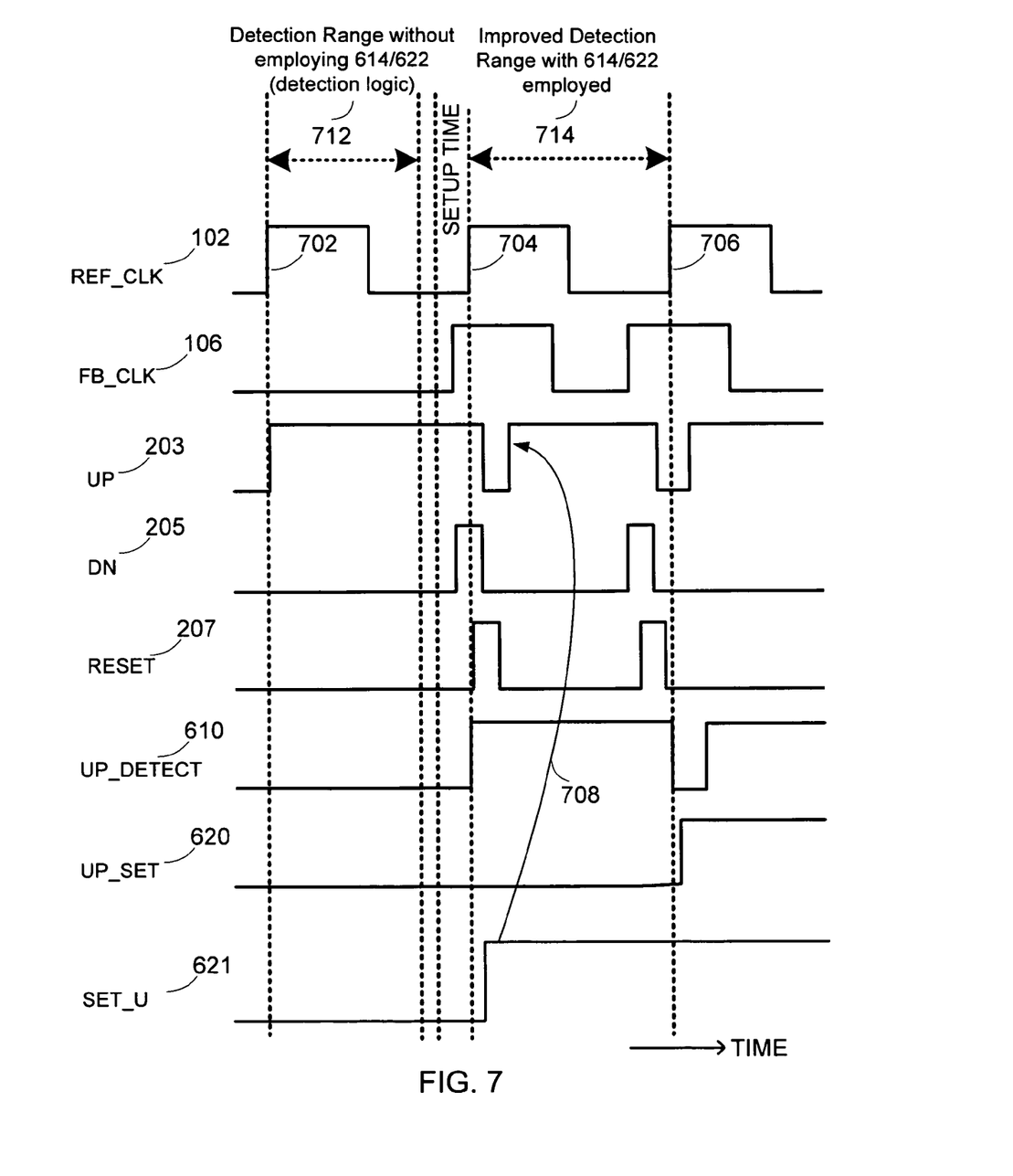
FIG. 7 illustrates an example of a timing diagram for an embodiment of the invention.

FIG. 7 illustrates a timing diagram of the circuit depicted in FIG. 6. From top to bottom, FIG. 7 includes waveforms for input clock signal REF_CLK 102, the feedback clock signal FB_CLK 106, the UP signal 203, the DN signal 205, the reset signal 207, an UP_DETECT signal 610, and a DN_DETECT signal 612.

The PFD circuit of FIG. 6 is symmetrical with respect to the input clock signal REF_CLK 102 and to the feedback clock signal FB_CLK 106. Thus, while FIG. 7 illustrates the operation of the input clock signal REF_CLK 102, the principles are also applicable to the feedback clock signal FB_CLK 106.

FIG. 7 illustrates a first rising edge 702, a second rising edge 704, and a third rising edge 706 of the input clock signal REF_CLK 102. At the first rising edge 702, the UP signal 203 is low, and thus, the UP_DETECT signal 610 is latched low. At the second rising edge 704, the UP signal 203 is high, and thus, the UP_DETECT signal 610 is latched high. When the UP_DETECT signal 610 is high, this indicates an occurrence of a missing clock edge over an extended zone such as the detection range 518 (FIG. 5).

In the illustrated embodiment, the UP_DETECT signal 610 is ANDed with the inverse of the UP signal 203 (with $\overline{UP}$), and the result is provided as an input to the D flip-flop 618. An output of the D flip-flop 618 generates the UP_SET signal 620, which is ORed with the UP_DETECT 610 signal to generate the SET_U signal 621, which sets the flip-flop 602. The high going UP_SET signal 620 then sets the UP signal 203 back to high (see arrow 708), as though the UP flip-flop 602 had not missed the edge. FIG. 7 also illustrates a setup time of about 100 picoseconds to 200 picoseconds (depends on implementation) for the UP flip-flop 602 and examples of a conventional detection range 712 and a new detection range 714 for a phase detector. The new detection range 714 depends on implementation and speeds and can be even broader, such as $1.8\pi$, where $2\pi$ corresponds to one clock cycle of the input clock signal REF_CLK 102.

Figure 8:
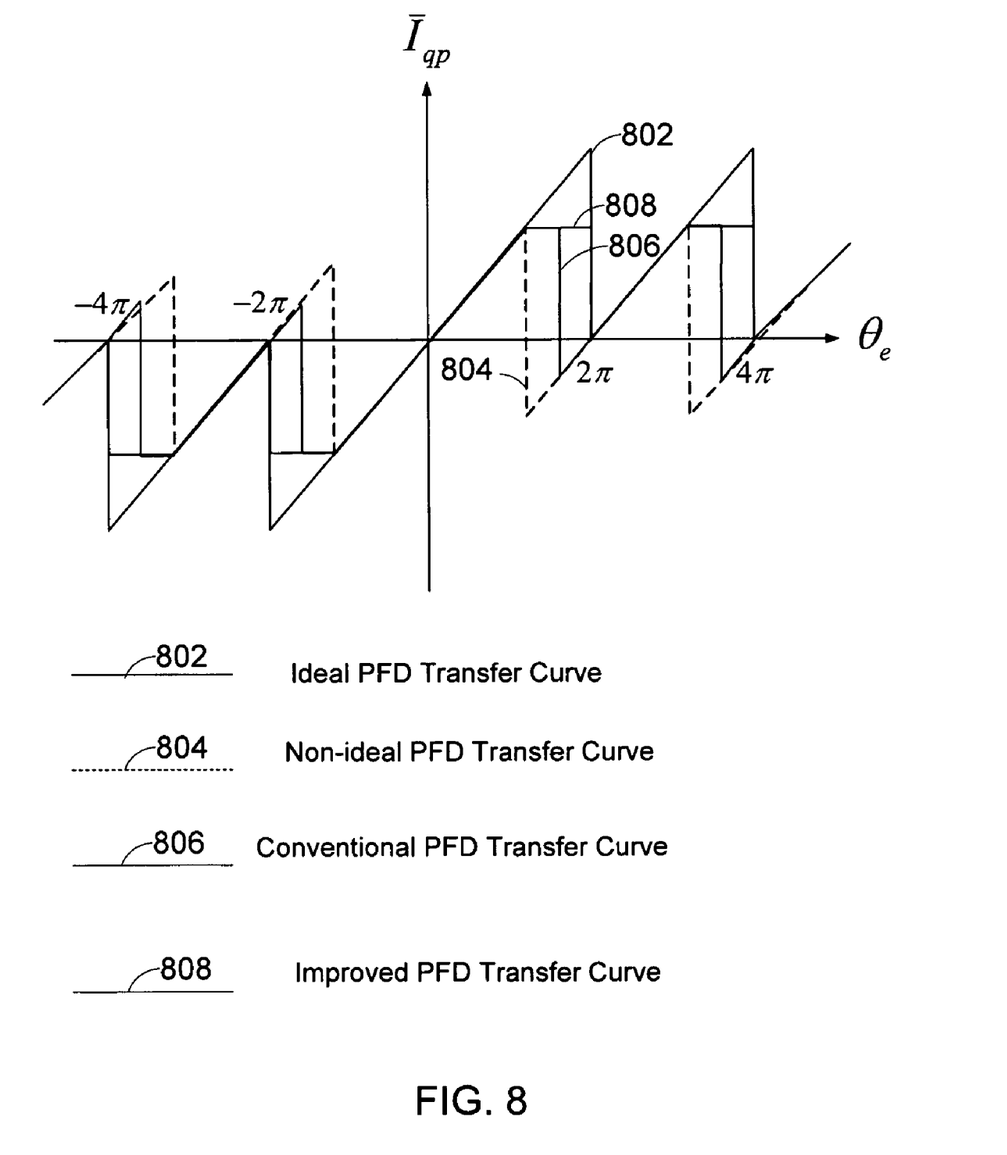
FIG. 8 illustrates a simulation of a transfer characteristic.

FIG. 8 illustrates a simulation of transfer characteristics for an ideal PD 802, non-ideal PD 804, a PD with a flat gain 806, and an embodiment of the invention 808. FIG. 8 illustrates an advantage of no gain reversal. This property is useful for operation at relatively high frequencies. With the missing clock edge detection circuit, the PFD has negligible output polarity reversal with flat transfer curve (no gain) between $1.4\pi$ and $2\pi$.

Figure 9:
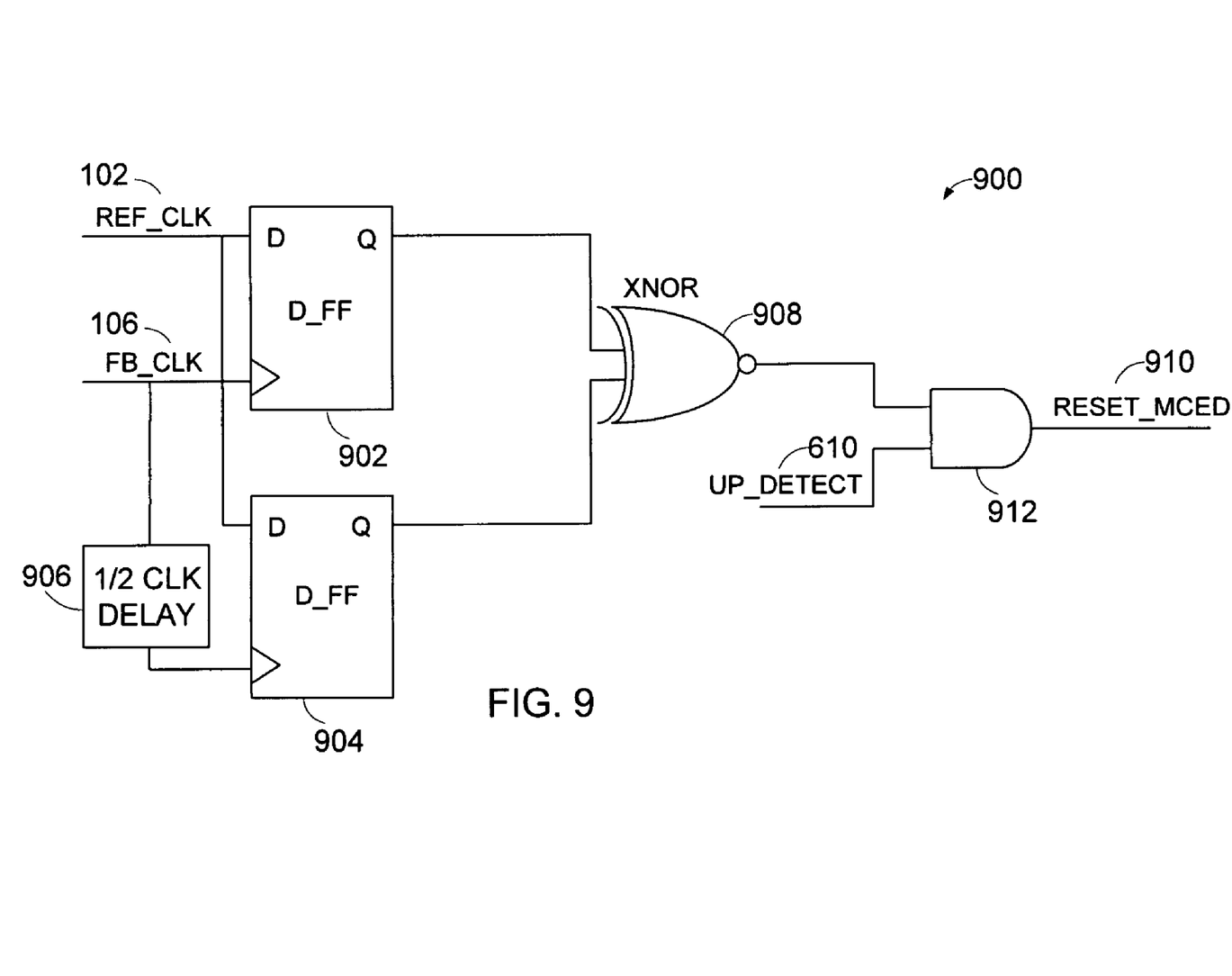
FIG. 9 illustrates a disabler circuit that determines if the missing clock edge detection circuit has inaccurately determined that a missing clock edge exists.

One embodiment optionally includes disabler circuitry 900 to override or disable the MCED circuit when it is determined that the MCED circuit may inaccurately determine the presence of a missing clock edge. If the missing clock edge is confirmed, the MCED circuit is permitted to correct the state of the up signal 203 or the down signal 205 as appropriate. Otherwise, the correction is bypassed or inhibited. For example, when the phase and frequency difference between the input clock signal REF_CLK 102 and the feedback clock signal FB_CLK 106 are very close, a disabler circuit can be used to override the MCED portion of the PLL circuit.

The circuit 900 illustrated in FIG. 9 will be described with reference to the "up" side of the MCED circuit. The circuit 900 can be mirrored for applicability to the "down" side of the MCED circuit by swapping the input clock signal REF_CLK 102 and feedback clock signal FB_CLK 106, and by swapping the DN_DETECT signal 612 for the UP_DETECT signal 610.

The flip-flops 902, 904 are configured to determine when there is a transition (triggering transition, such as rising edge) of the input clock signal REF_CLK 102 within each half cycle of the feedback clock signal FB_CLK 106. A half-clock delay circuit 906, which can be implemented by, for example gate delays, can be used to generate edges at half cycles. The outputs of the flip-flops 902, 904 are then exclusive-NOR'd by an XNOR gate 908. When there is zero or only one transition within the cycle of the feedback clock signal FB_CLK 106, the output of the XNOR gate 908 is low. No action is taken in this situation as the MCED circuit should be performing as expected.

If there are two transitions (one per half cycle), the output of the XNOR gate 908 goes high. When the output of the XNOR gate 908 is high and the signal UP_DET 610 is high, then the MCED circuit should be reset, and the output RESET_MCED 910 of the AND circuit 912 goes high. The RESET_MCED signal 910 can be used to reset, for example, the flip-flops 606, 618 (FIG. 6).

Embodiments of the invention can be used in a wide variety of applications. Examples include, but are not limited to, clock synthesis through PLL; multiple-clock phase generation (synthesis) for serializer/deserializer (SERDES) through PLL; clock skew generation (DLL) for data transmission systems; PLL for data transmission system; clock recovery systems for frequency discrimination; PLL for frequency duplexed RF applications (fast frequency acquisition can enable switching from one frequency mode to another without dual PLLs); and the like.

Advantages can include, but are not limited to: (1) reliable detection of missing clock edges; (2) optional missing clock edge limitation detection; (3) relatively low power implementation; (4) independence with respect to parametric variation compared to the entire prior art which can depend on reset-pulse width, fast logic speed and/or delay path; (5) can be implemented without special fast logic, reducing power consumption; (6) no region of output polarity reversal, resulting in faster frequency acquisition than conventional PLL with polarity reversal; and (7) fast operational speed.

Various embodiments have been described above. Although described with reference to these specific embodiments, the descriptions are intended to be illustrative and are not intended to be limiting. Various modifications and applications may occur to those skilled in the art.

What is claimed is:

1. An apparatus comprising:
a phase frequency detector configured to receive a first clock signal and a second clock signal, the phase frequency detector responsive to triggering edges of the first clock signal and the second clock signal, the phase frequency detector configured to generate an up signal and a down signal as control signals for a charge pump of a phase detector, wherein states of the up signal and a state of the down signal are based at least partially on the triggering edges of the first clock signal and the second clock signal, respectively;
a missing clock edge detection circuit configured to determine when a particular triggering edge of the first clock signal or the second clock signal that should generate a response from the phase frequency detector has been missed by the phase frequency detector, and to correct the state of the up signal or the state of the down signal in response to a determination of a missed clock edge; and a bypass circuit configured to determine whether a missing clock edge determination by the missing clock edge detection circuit is accurate or not, wherein when the determination is accurate, the bypass circuit is configured to permit the missing clock edge detection circuit to correct the state of the up signal or the state of the down signal, and when the determination is inaccurate, the bypass circuit is configured to inhibit correction by the missing clock edge detection circuit.

2. An apparatus comprising:
a phase frequency detector configured to receive a first clock signal and a second clock signal, the phase frequency detector responsive to triggering edges of the first clock signal and the second clock signal, the phase frequency detector configured to generate an up signal and a down signal as control signals for a charge pump of a phase detector, wherein states of the up signal and a state of the down signal are based at least partially on the triggering edges of the first clock signal and the second clock signal, respectively, wherein the phase frequency detector comprises:
a first flip-flop having a clock input operatively coupled to the first clock signal and having a data input coupled to a first state such that the first flip-flop is configured to latch the up signal to the first state upon occurrence of triggering edges of the first clock signal;
a second flip-flop having a clock input operatively coupled to the second clock signal and having a data input coupled to the first state such that the second flip-flop is configured to latch the down signal to the first state upon occurrence of triggering edges of the second clock signal;
a reset circuit configured to reset the first flip-flop and the second flip-flop to a second state opposite the first state when both the up signal and the down signal are at the first state; and
a missing clock edge detection circuit configured to determine when a particular triggering edge of the first clock signal or the second clock signal that should generate a response from the phase frequency detector has been missed by the phase frequency detector, and to correct the state of the up signal or the state of the down signal in response to a determination of a missed clock edge, wherein the missing clock edge detection circuit comprises:
a third flip-flop having a clock input operatively coupled to the first clock signal, having a data input operatively coupled to the up signal, wherein the third flip-flop is configured to latch a state of the up signal upon occurrence of triggering edges of the first clock signal to generate an UP_DETECT signal;
a first detection logic circuit configured to set the first flip-flop to the first state when (a) the UP_DETECT signal is at the first state or (b) the up signal is at the second state and the UP_DETECT signal is at the first state at a triggering edge of the first clock signal;
a fourth flip-flop having a clock input operatively coupled to the second clock signal, having a data input operatively coupled to the down signal wherein the fourth flip-flop is configured to latch a state of the down signal upon occurrence of triggering edges of the second clock signal to generate a DN_DETECT signal; and
a second detection logic circuit configured to set the second flip-flop to the first state when (a) the DN_DETECT signal is at the first state or (b) the down signal is at the second state and the DN_DETECT signal is at the first state at a triggering edge of the second clock signal.

3. The apparatus of claim 2:
wherein the first state is logic high and the second state is logic low;
wherein the flip-flops are D flip-flops, and wherein the all triggering edges are rising edges;
wherein the reset circuit comprises a first AND gate having the up signal and the down signal as inputs, wherein an output of the first AND gate is operatively coupled to reset inputs of the first flip-flop and the second flip-flop;
wherein the first detection logic circuit comprises a second AND gate, a fifth flip-flop and a first OR gate, wherein the second AND gate has the UP_DETECT signal and an inverted version of the up signal as inputs, wherein an output of the second AND gate is operatively coupled to a data input of the fifth flip-flop, wherein a clock input of the fifth flip-flop is coupled to the first clock signal, wherein an output of the fifth flip-flop and the UP_DETECT signal are operatively coupled to the first OR gate as inputs, wherein an output of the first OR gate is operatively coupled to a set input of the first flip-flop; and
wherein the second detection logic circuit comprises a third AND gate, a sixth flip-flop, and a second OR gate wherein the third AND gate has the DN_DETECT signal and an inverted version of the down signal as inputs, wherein an output of the third AND gate is operatively coupled to a data input of the sixth flip-flop, wherein an output of the sixth flip-flop and the DN_DETECT signal are operatively coupled to the second OR gate as inputs, wherein an output of the second OR gate is operatively coupled to a set input of the second flip-flop.

4. The apparatus of claim 3, further comprising a bypass circuit configured to determine whether a missing clock edge determination by the missing clock edge detection circuit is accurate or not, wherein when the determination is accurate, the bypass circuit is configured to permit the missing clock edge detection circuit to correct the state of the up signal or the state of the down signal, and when the determination is inaccurate, the bypass circuit is configured to inhibit correction by the missing clock edge detection circuit.

5. The apparatus of claim 4, wherein the bypass circuit comprises an upper bypass circuit and a lower bypass circuit:
the upper bypass circuit comprising:
a seventh flip-flop having a data input, a clock input, and an output, wherein the first clock signal is operatively coupled to the data input, and wherein the second clock signal is operatively coupled to the clock input;
a first delay circuit having an input operatively coupled to the second clock signal, the first delay circuit configured to generate a delayed second clock signal that is delayed from the second clock signal by about half a clock period of the second clock signal;
an eighth flip-flop having a data input, a clock input, and an output, wherein the first clock signal is operatively coupled to the data input, and wherein the delayed second clock signal is operatively coupled to the clock input;
a first exclusive-NOR (XNOR) gate having inputs coupled to outputs of the seventh flip-flop and the eighth flip-flop; and
a third AND gate having inputs coupled to an output of the first XNOR gate and to the UP_DETECT signal,
wherein an output of the third AND gate is operatively coupled to reset inputs of the third flip-flop and the fifth flip-flop;
the lower bypass circuit comprising:
a ninth flip-flop having a data input, a clock input, and an output, wherein the second clock signal is operatively coupled to the data input, and wherein the first clock signal is operatively coupled to the clock input;
a second delay circuit having an input operatively coupled to the first clock signal, the second delay circuit configured to generate a delayed first clock signal that is delayed from the first clock signal by about half a clock period of the first clock signal;
a tenth flip-flop having a data input, a clock input, and an output, wherein the second clock signal is operatively coupled to the data input, and wherein the delayed first clock signal is operatively coupled to the clock input;
a second exclusive-NOR (XNOR) gate having inputs coupled to outputs of the ninth flip-flop and the tenth flip-flop; and
a fourth AND gate having inputs coupled to an output of the second XNOR gate and to the DN_DETECT signal, wherein an output of the fourth AND gate is operatively coupled to reset inputs of the fourth flip-flop and the sixth flip-flop.

6. The apparatus of claim 2, wherein the apparatus comprises a delay-locked loop (DLL).

7. The apparatus of claim 2, wherein the apparatus comprises a phase-locked loop (PLL).

8. A method for phase detection, the method comprising:
monitoring a phase frequency detector, wherein the phase frequency detector is configured to receive a first clock signal and a second clock signal and to generate an up signal and a down signal for control of a charge pump of a phase detector, wherein states of the up signal and a state of the down signal are based at least partially on triggering edges of the first clock signal and the second clock signal, respectively;
determining when a particular triggering edge of the first clock signal or the second clock signal has been missed by the phase frequency detector;
correcting the state of the up signal or the state of the down signal in response to a determination of a missed clock edge; and
determining whether a missing clock edge determination is accurate or not, wherein when the determination is accurate, permitting the correction of the state of the up signal or the state of the down signal, and when the determination is inaccurate, inhibiting the correction of the state of the up signal or the state of the down signal.

9. A method for phase detection, the method comprising:
monitoring a phase frequency detector, wherein the phase frequency detector is configured to receive a first clock signal and a second clock signal and to generate an up signal and a down signal for control of a charge pump of a phase detector, wherein states of the up signal and a state of the down signal are based at least partially on triggering edges of the first clock signal and the second clock signal, respectively, wherein the phase frequency detector comprises:
a first flip-flop having a clock input operatively coupled to the first clock signal and having a data input coupled to a first state such that the first flip-flop is configured to latch the up signal to the first state upon occurrence of triggering edges of the first clock signal;

a second flip-flop having a clock input operatively coupled to the second clock signal and having a data input coupled to the first state such that the second flip-flop is configured to latch the down signal to the first state upon occurrence of triggering edges of the second clock signal;

a reset circuit configured to reset the first flip-flop and the second flip-flop to a second state opposite the first state when both the up signal and the down signal are at the first state;

determining when a particular triggering edge of the first clock signal or the second clock signal has been missed by the phase frequency detector;

wherein determining when a particular triggering edge of the first clock signal has been missed comprises determining that (a) an UP_DETECT signal is at the first state or (b) the up signal is at the second state and the UP_DETECT signal is at the first state at a triggering edge of the first clock signal, wherein the UP_DETECT signal is generated by storing a state of the up signal at the triggering edge of the first clock signal;

wherein determining when a particular triggering edge of the second clock signal has been missed comprises determining that (a) a DN_DETECT signal is at the first state or (b) the down signal is at the second state and the DN_DETECT signal is at the first state at a triggering edge of the second clock signal, wherein the DN_DETECT signal is generated by storing a state of the down signal at the triggering edge of the second clock signal;

correcting the state of the up signal or the state of the down signal in response to a determination of a missed clock edge;

wherein correcting the state of the up signal comprises setting the first flip-flop to the first state upon the determination of the missed triggering edge of the first clock signal; and wherein correcting the state of the down signal comprises setting the second flip-flop to the first state upon the determination of the missed triggering edge of the second clock signal.

10. The method of claim 9:
wherein the first state is logic high and the second state is logic low; and
wherein the flip-flops are D flip-flops, and wherein the all triggering edges are rising edges.

11. The method of claim 9, wherein the method is embodied in a delay-locked loop (DLL).

12. The method of claim 9, wherein the method is embodied in a phase-locked loop (PLL).

13. The method of claim 9, wherein the method is performed with no gain reversal.

14. An apparatus for phase detection, the apparatus comprising:

a phase frequency detector configured to receive a first clock signal and a second clock signal, the phase frequency detector responsive to triggering edges of the first clock signal and the second clock signal, the phase frequency detector configured to generate an up signal and a down signal as control signals for a charge pump of a phase detector, wherein states of the up signal and a state of the down signal are based at least partially on the triggering edges of the first clock signal and the second clock signal, respectively;

means for determining when a particular triggering edge of the first clock signal or the second clock signal has been missed by the phase frequency detector; means for correcting the state of the up signal or the state of the down signal in response to a determination of a missed clock edge; and means for determining whether a missing clock edge determination is accurate or not, wherein when the determination is accurate, permitting the correction of the state of the up signal or the state of the down signal, and when the determination is inaccurate, inhibiting the correction of the state of the up signal or the state of the down signal.

\* \* \* \* \*